United States Patent [19]
Muellner

[11] Patent Number: 5,012,137
[45] Date of Patent: Apr. 30, 1991

[54] ECL-CMOS CONVERTER

[75] Inventor: Ernst Muellner, Munich, Fed. Rep. of Germany

[73] Assignee: Siemens Aktiengesellschaft, Munich, Fed. Rep. of Germany

[21] Appl. No.: 380,593

[22] Filed: Jul. 17, 1989

[30] Foreign Application Priority Data

Jul. 22, 1988 [DE] Fed. Rep. of Germany ....... 3825010

[51] Int. Cl.$^5$ ...................... H03K 19/92; H03K 19/3; H03K 19/86; H03K 17/10
[52] U.S. Cl. ..................................... 307/475; 307/446; 307/570; 307/443; 307/448; 307/542; 307/547; 307/548
[58] Field of Search ............... 307/475, 448, 446, 455, 307/443, 542, 546–548, 573–577, 579, 585, 264, 570, 451, 473, 362, 368; 323/315–317

[56] References Cited

U.S. PATENT DOCUMENTS

| | | | |
|---|---|---|---|
| 4,316,105 | 2/1982 | Fowler | 307/362 |
| 4,518,880 | 5/1985 | Masuda et al. | 307/577 |
| 4,713,560 | 12/1987 | Herndon | 307/446 X |
| 4,797,583 | 1/1989 | Ueno et al. | 307/475 |
| 4,800,303 | 1/1989 | Graham et al. | 307/475 X |
| 4,810,902 | 3/1989 | Storti et al. | 307/446 |
| 4,835,487 | 5/1989 | Doyle et al. | 323/315 X |
| 4,906,871 | 3/1990 | Iida | 307/475 |

OTHER PUBLICATIONS

"13ns/500 mw 64 kb ECL RAM", by Katsumi Ogiue et al., Hitachi Device Development Center, Tokyo, Japan, IEEE ISSCC, 1986, pp. 212–213, Static RAMs, THPM 16.6.

"The Design of Wide-Band Transistors Feedback Amplifiers", by E. M. Cherry et al., in Proc. IEEE, vol. 110, No. 2, Feb. 1963, pp. 375–389.

"For Gb/s Limiting Amplifier for Optical-Fiber Receivers", by R. Reimann, H. M. Rein, ISSCC Digest of Technical Papers, Feb. 1987, p. 172.

Primary Examiner—Stanley D. Miller
Assistant Examiner—David Robertelson
Attorney, Agent, or Firm—Hill, Van Santen, Steadman & Simpson

[57] ABSTRACT

An ECL-CMOS converter composed of a voltage-to-current converter and of a current-to-voltage converter is interconnected according to the "mismatched amplifier" principle. At two inputs of the voltage-to-current converter, the ECL input voltages are converted into a current that can be taken at an output of the voltage-to-current converter. The current is subsequently amplified in a current-to-voltage converter to an output voltage that is available at an output of the current-to-voltage converter. The current-to-voltage converter is composed of a feedback inverter stage, as a result thereof the operating point at an input of the current-to-voltage converter is stabilized at about half of an operating voltage of the converter.

15 Claims, 1 Drawing Sheet 5,012,137

ECL-CMOS CONVERTER

BACKGROUND OF THE INVENTION

The present invention is directed to an ECL-CMOS converter for converting ECL back to CMOS levels.

ECL and CMOS circuits are used extensively in semiconductor circuit technology. The ECL (emittercoupled logic) circuits have the shortest switching times of all logic families. These switching times lie in the area of a few nanoseconds and may also extend to below one nanosecond. Complimentary MOSFET transistors are utilized in CMOS circuits. The ohmic output load of the CMOS circuits is extremely low because of the high input impedances. The switching time increases with a higher capacitative output load. Given a high capacitative output load, the switching time can have an order of magnitude of about 10 ns and above.

In addition to MOS circuit technology, a bipolar CMOS (BICMOS) circuit technology has been recently developed that is particularly useful in time-critical and compact circuits. Advantages from MOS circuit technology as well as from bipolar circuit technology are due to the use of BICMOS circuits. High packing densities and low static dissipated power are characteristic of circuits composed of CMOS circuit technology, whereas low offset voltage and extremely high processing speed are characteristic of circuits in ECL or bipolar circuit technology. These characteristics are features that make use of circuits in "BICMOS" circuit technology desireable. Extremely high operating speeds can be achieved with the use of "BICMOS" circuit technology because the circuit portions having higher processing speeds are realized in ECL circuit technology but less time-critical circuit portions are realized in CMOS circuit technology. Fast level converters are required between these two circuit portions or blocks, whereby the conversion of ECL level into CMOS level is more technically difficult to realize than a reverse conversion of CMOS level into ECL level.

FIG. 1 shows a prior art ECL-CMOS converter wherein, first, a bipolar differential amplifier is utilized in order to amplify the ECL level to an intermediate level. This level is set by the selection of one or more collector resistors. Further amplification to the CMOS level is effected by a CMOS circuit. A CMOS differential amplifier or a CMOS inverter stage can be used for this purpose, whereby the necessary level matching is achieved with emitter followers or level shifters, which uses additional power. The circuit shown in FIG. 1 is composed of a bipolar, asymmetrical differential amplifier that acts as voltage amplifier, of a following stage of an emitter follower (also referred to as a level shifter) and of a CMOS output stage. Further ECL-CMOS converters are known from the literature, for example from the publication IEEE ISSCC, 1986, pages 212-213, Static RAMs, THPM 16.6: "13ns/500 mw 64 kb ECL RAM" by Katsumi Ogiue et al, Hitachi Device Development Center, Tokyo, Japan. FIG. 3 of this publication discloses an ECL-CMOS converter that is composed of a symmetrical differential amplifier, of a level shifter and of a CMOS output stage. The ECL levels in this circuit fluctuate between −0.9 volts and −1.7 volts and are converted by the ECL-CMOS converter to a MOS level of 0.0 volts through −5.2 volts.

When a CMOS inverter stage is used in the output stage in the ECL-CMOS converter, the temperature and fluctuations in operating voltage have a very pronounced effect since the levels from the bipolar differential amplifier are referenced to the positive supply voltage, whereas the threshold of the CMOS amplifier always lies in the middle between the two supply voltages (approximately −2.5 volts).

SUMMARY OF THE INVENTION

An object of the present invention is to provide an ECL-CMOS converter that can convert ECL levels into CMOS levels in the optimally shortest processing time and whereby effects due to temperature fluctuations and fluctuations in operating voltage are minimal.

In general terms the ECL-CMOS converter of the present invention has a voltage-to-current converter connected in series with a current-to-voltage converter. First and second inputs of the voltage-to-current converter are first and second inputs of the ECL-CMOS converter. An output of the current-to-voltage converter is an output of the ECL-CMOS converter.

The advantages obtained with the present invention are that the circuit of the present invention produces no problems for level matching between the bipolar and the CMOS stage, that no emitter follower (level shifters) are required and, thus, a reduced power consumption results. A further advantage of the ECL-CMOS converter of the present invention is that variations in the values of resistance that can occur in the manufacture of such circuits are compensated and do not deteriorate the functionability of the ECL-CMOS converter.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures in which like reference numerals identify like elements, and in which:

DESCRIPTION OF THE PREFERRED EMBODIMENT

Figure 1:
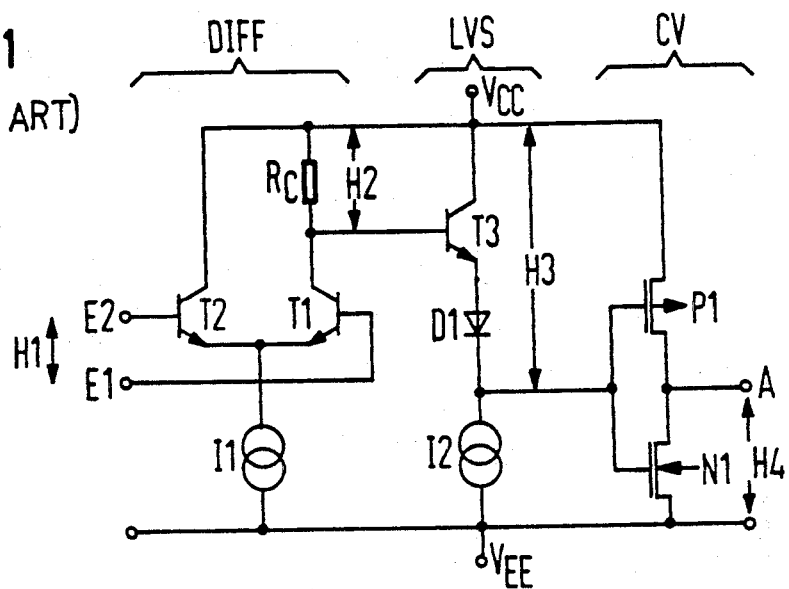
FIG. 1 is a prior art ECL-CMOS converter having a bipolar differential amplifier, an emitter follower and a CMOS amplifier.

The prior art ECL-CMOS converter shown in FIG. 1 contains a bipolar differential amplifier DIFF with a following emitter follower LVS (also referred to as level shifter) and a terminating CMOS amplifier CV. Both the bipolar differential amplifier as well as the CMOS amplifier are connected as voltage amplifiers, so that both have a high-impedance input and a low output impedance. The bipolar differential amplifier DIFF contains two bipolars npn transistors T1, T2 as well as a collector resistor RC via which occurs an asymmetrical output coupling for the following emitter follower LVS. A respective base terminal of both the first and second bipolar npn transistor T1 and T2 forms inputs E1, E2 of the differential amplifier. Both emitter terminals of the two transistors are connected to a first supply voltage $V_{EE}$ (for example, −4.5 volts) via a current source I1. The collector output of the first bipolar npn transistor T1 is connected to a second supply voltage $V_{CC}$ (for example, 0 volts) via a collector resistor $R_C$ and the collector terminal of the second bipolar npn transistor T2 is connected to the supply voltage $V_{CC}$. Voltage levels H1 of approximately 200 MV are applied to the input of the bipolar differential amplifier, these voltage levels corresponding to the ECL voltage levels. Voltage levels H2 of approximately +1.5 volts can be subsequently measured via the collector resistor $R_C$, these voltage levels being converted to intermediate voltage levels H3 of 1.5 volts lowered by 1.7 volts in the connected emitter follower.

The emitter follower of FIG. 1 is composed of a bipolar npn transistor T3 at whose emitter terminal a diode D1 has its anode side connected. The collector terminal of the third bipolar npn transistor T3 is connected to the second supply voltage $V_{CC}$ and the base terminal of the transistor T3 is connected to the collector terminal of the first bipolar npn transistor T1 in the differential amplifier DIFF. The measured intermediate voltage level H3 can be taken between the cathode terminal of the diode D1 and the collector terminal of the third npn transistor T3. A second current source I2 is connected to the cathode side of the diode D1, this second current source I2 having its second terminal connected to the first supply voltage $V_{EE}$.

A CMOS amplifier CV is provided as an output stage of the ECL-CMOS converter, this CMOS amplifier CV being constructed of a p-channel enhancement MOSFET P1 and of an n-channel enhancement MOSFET N1, whereby a first terminal of the p-channel MOSFET P1 is connected to the second supply voltage $V_{CC}$ and a first terminal of the n-channel MOSFET N1 is connected to the first supply voltage $V_{EE}$. The gate terminals of the n-channel and p-channel MOSFETs P1, N1 together form the input of the CMOS amplifier and are connected to the cathode side of the diode D1 of the emitter follower LVS. The output of the CMOS amplifier is formed by the two second terminals of the p-channel and n-channel enhancement MOSFETs P1, N1, whereby voltage levels H4 of +4.5 volts can be taken. As already mentioned, the switching threshold of the CMOS amplifier at its input is approximately in the middle between the two supply voltages $V_{CC}$ and $V_{EE}$, i.e. at approximately $-2.25$ volts (with reference to $V_{CC}$).

As a consequence of temperature fluctuations and fluctuations in operating voltage, a level at the output of the emitter follower (with reference to $V_{CC}$) can be so greatly influenced that the intermediate voltage level H3 no longer lies symmetrically around a switching threshold for the CMOS amplifier of approximately $-2.25$ volts (with reference to $V_{CC}$). An ECL-CMOS converter of the present invention shall now be described below with reference to FIG. 2, which converts an ECL level into a CMOS level largely independent of temperature fluctuations and of fluctuations in operating voltage.

Figure 2:
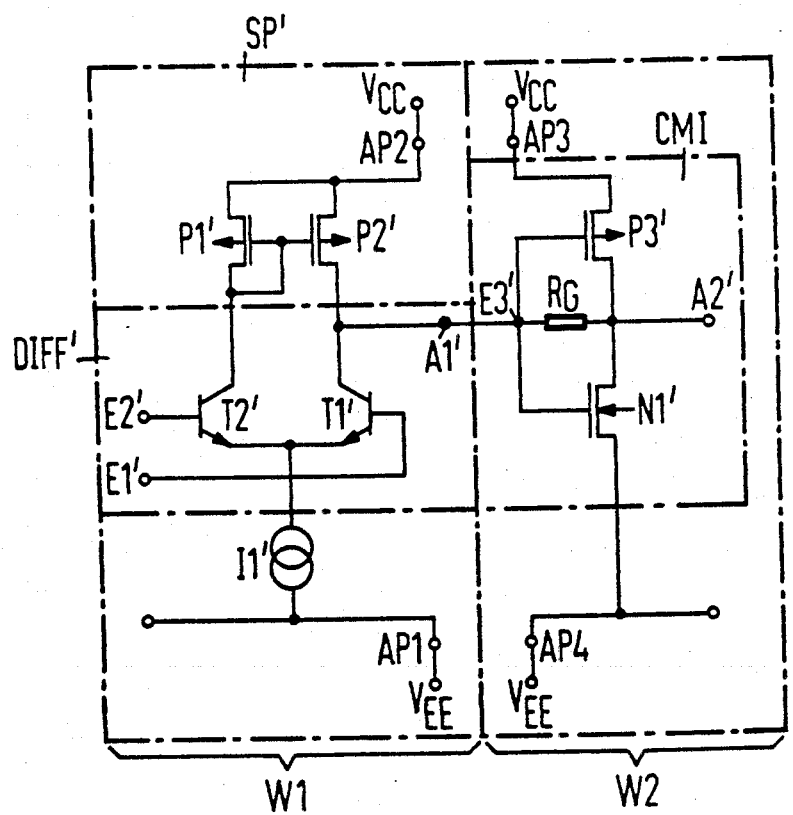
FIG. 2 is a circuit diagram of an ECL-CMOS converter of the present invention having a voltage-to-current converter and a following current-to-voltage converter.

The ECL-CMOS converter of the present invention shown in FIG. 2 contains a voltage-to-current converter W1 as well as a current-to-voltage converter W2, whereby the current-to-voltage converter W2 is connected in series with the voltage-to-current converter W1. High-impedance inputs E1' and E2' for the voltage-to-current converter W1, a low-impedance input E3' for the current-to-voltage converter W2, a high-impedance output A1' for the voltage-to-current converter W1 and a low-impedance output A2' for the current-to-voltage converter W2 are provided. The intentional mismatching of the voltage-to-current converter W1 to the current-to-voltage converter W2 has been known for some time under the principle of "mismatched amplifiers" in the publication of "The Design of Wide-Band transistors feedback amplifiers" by E. M. Cherry et al in Proc. IEE, Vol. 110, No. 2, February 1963. This principle, however, was previously used to achieve a high bandwidth in bipolar amplifiers (see, in this respect, R. Reimann, H. M. Rein, "For Gb/s Limiting Amplifier for Optical-Fiber Receivers", ISSCC Digest of Technical Papers, February 1987, page 172), whereas it is used in the ECL-CMOS converter of the present invention to compensate for fluctuations in parameters, temperature and supply voltage for a "BIC-MOS" circuit.

More specifically, the voltage-to-current converter W1 is composed of a current source I1', of a differential amplifier DIFF' as well as of a current-mirror circuit SP', whereas the current-to-voltage converter W2 is constructed of a feedback CMOS inverter stage CMI. The differential amplifier DIFF' contains two bipolar npn transistors T1' and T2', whereby the first input E1' is connected to the base of the first bipolar npn transistor T1' and the second input E2' is connected to the base of the second bipolar npn-transistor T2'. The emitters of the first and second npn transistors T1' and T2' are connected in common to the first supply voltage $V_{EE}$ via the current source I1', whereby the current source I1' is constructed with MOS field effect transistors and the first supply voltage $V_{EE}$ typically is at $-4.5$ volts. The specification of the first supply voltage as well as all further voltage specifications are referenced to $V_{CC}$. It is likewise possible to operate the ECL-CMOS converter with supply voltages that deviate from the typical supply voltage of $V_{EE} = -4.5$ volts. Beginning with a voltage of $V_{EE} = -5$ volts, the construction of a current source composed of bipolar transistors is also possible.

The collector terminal of the first and second bipolar npn transistor T1' and T2' are connected to the current-mirror circuit SP', whereby the collector of the first bipolar npn transistor T1' also forms the output A1' of the voltage-to-current converter W1. The current-mirror circuit SP' is constructed of two enhancement p-channel MOSFETs P1' and P2', whereby the gate terminals of the two p-channel MOS field effect transistors P1' and P2', together with a first terminal of the first p-channel MOS field effect transistor P1', are connected to the collector of the second bipolar npn transistor T2'. Further, a first terminal of the second p-channel MOS field effect transistor P2' is connected to the collector of the first bipolar npn transistor T1'. Finally, the current-mirror circuit SP' is connected to the second supply voltage $V_{CC}$ (0 volts in this case) via the second terminals of the first and second p-channel MOS field effect transistors P1' and P2'. Due to the bipolar differential stage DIFF' and the connected current-mirror circuit SP', an ECL voltage signal on the inputs E1' and E2' is converted into a current defined by the current source I1', this current being capable of being taken at the output A1' of the voltage-to-current converter W1. In the current-to-voltage converter W2, this current is amplified to an output voltage by a CMOS inverter stage CMI with a feedback resistor $R_G$.

The CMOS inverter stage of the current-to-voltage converter W2 is formed of an n-channel enhancement MOS field effect transistor N1' and of a p-channel enhancement MOS field effect transistor P3', whereby a first terminal of the n-channel MOS field effect transistor N1' is connected to the first supply voltage $V_{EE}$ and a first terminal of the p-channel MOS field effect transistor P3' is connected to the second supply voltage $V_{CC}$. The input of the CMOS inverter stage that also forms the input E3' of the current-to-voltage converter W2 is connected both to the gate terminals of the n-channel and p-channel MOS field effect transistors N1' and P3' as well as to the output of the CMOS inverter stage via the feedback resistor $R_G$. Further, the output of the CMOS inverter stage that also forms the output A2' of the current-to-voltage converter W2 is connected to a second terminal of the n-channel MOS field effect transistor N1' and to a second terminal of the p-channel MOS transistor P3'.

As a result of the principle of the "mismatched amplifier" that is applied between the voltage-to-current converter W1 and the current-to-voltage converter W2, the potential and the voltage level at the output A1' of the voltage-to-current converter W1 or at the input E3' of the current-to-voltage converter W2 is set by the CMOS inverter stage CMI with the feedback resistor $R_G$. As a result the emitter followers that are necessary in the prior art between the bipolar differential amplifier and a CMOS inverter stage can be eliminated. Due to the low-impedance input E3' of the current-to-voltage converter W2, the operating point at the output A1' of the voltage-to-current converter W1 further stabilizes to approximately half the first supply voltage ($V_{EE}/2$).

Problems no longer occur with respect to the level matching between the bipolar differential amplifier and the CMOS inverter stage since, in contrast to the ECL-CMOS converter of FIG. 1, the CMOS inverter stage of CMI of FIG. 2 is driven with current intensities that are proportional to the ECL input voltages. Variations in the values of resistance are likewise compensated by a corresponding drive of the current source I1'. The output voltage level at the output A2', however, lies approximately 0.6 volts below the first supply voltage $V_{EE}$ as a consequence of the feedback provided by the feedback resistor $R_G$.

For dimensioning the ECL-CMOS converter of the present invention, the current $I_Q$ to be output by the current source I1' is defined in a first specification. This is carried out based on desired speed, possible dissipated power and existing chip area. As a result it is possible to dimension the channel widths of the MOS field effect transistors of the current-mirror circuit SP' and the npn bipolar transistors of the differential stage DIFF'. In a second specification, an internal voltage boost or level $U_{boost}$ is defined at the output A1' of the voltage-to-current converter W1 (for example, ±0.5 volts). Finally, in a third specification the residual voltage $U_R$ at the output A2' of the current-to-voltage converter W2 is estimated so that the following MOS circuits can also be reliably operated. Approximately 0.6 volts can be assumed as an example of the residual voltage. Finally, from the second and third specifications the feedback resistor $R_G$ can be calculated:

$$R_G = (|V_{EE}/2| - |U_R| + |U_{boost}|)/I_Q.$$

A definition of the channel widths for the MOS output transistors N1' and P4' can be undertaken from the specifications of the supply voltage $V_{EE}$, of the residual voltage $U_R$, of the boost voltage $U_{boost}$ and from the characteristics field for MOS field effect transistors.

Given the voltage particulars, $V_{CC}$ equal to 0 volts and $V_{EE}$ equal to approximately −4.5 volts were selected; however, other voltage values for $V_{CC}$ and $V_{EE}$ are also conceivable. What is important is that the second supply voltage $V_{CC}$ is greater than the first supply voltage $V_{EE}$.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. ECL-CMOS converter for converting ECL levels into CMOS levels, comprising a voltage-to-current converter connected in series with a current-to-voltage converter, first and second inputs of the voltage-to-current converter being first and second inputs of the ECL-CMOS converter and an output of the current-to-voltage converter being an output of the ECL-CMOS converter; the current-to-voltage converter containing a feedback CMOS inverter stage; a first input of the feedback CMOS inverter stage forming an input of the current-to-voltage converter and being connected via a feedback element to an output of the CMOS inverter stage; the output of the CMOS inverter stage forming the output of the current-to-voltage converter; a second input of the CMOS inverter stage being connected to a third terminal point and a third input thereof being connected to a fourth terminal point; and the feedback CMOS inverter stage also containing an enhancement p-channel MOS field effect transistor and an enhancement n-channel MOS field effect transistor; a first terminal of the enhancement p-channel field effect transistor being connected to the second input of the CMOS inverter stage; a first terminal of the enhancement n-channel MOS field effect transistor being connected to the third input of the MOS inverter stage; the first input of the CMOS inverter stage being directly connected to a gate terminal of the p-channel enhancement MOS field effect transistor and to a gate terminal of the n-channel enhancement MOS field effect transistor; a second terminal of the p-channel enhancement MOS field effect transistor and a second terminal of the n-channel enhancement MOS field effect transistor each being connected to the output of the CMOS inverter stage; the third terminal point being connected to the second supply voltage and the fourth terminal point being connected to the first supply voltage.

2. The ECL-CMOS converter according to claim 1, wherein the voltage-to-current converter contains a current source, a differential stage and a current mirror circuit; the first input of the voltage-to-current converter being connected to a first input of the differential stage and the second input of the voltage-to-current converter being connected to a second input of the differential stage; a third input of the differential stage connected to a first terminal point via the current source; first and second outputs of the differential stage connected respectively to first and second inputs of the current-mirror circuit; the second output of the differential stage forming an output of the voltage-to-current converter; a third input of the current-mirror circuit connected to a second terminal point.

3. The ECL-CMOS converter according to claim 1, wherein the feedback element is a feedback resistor.

4. The ECL-CMOS converter according to claim 2, wherein the differential stage contains first and second bipolar npn transistors; a base terminal of the first bipolar npn transistor forming the first input of the differential stage and a base terminal of the second bipolar npn transistor forming the second input of the differential stage; emitter terminals of the first and second bipolar npn transistors each being connected to the first terminal point via the current source; a collector of the second bipolar npn transistor forming the first output of the differential stage and a collector of the first bipolar npn transistor forming the second output of the differential stage; and the first terminal point being connected to a first supply voltage.

5. The ECL-CMOS converter according to claim 2, wherein the current-mirror circuit contains first and second enhancement p-channel MOS field effect transistors; a first terminal of the first enhancement p-channel MOS field effect transistor forming the first input of the current-mirror circuit and a first terminal of the second enhancement p-channel MOS transistor forming the second input of the current-mirror circuit; the first terminal of the first enhancement p-channel MOS transistor being connected to gate terminals of the first and second enhancement p-channel MOS transistor; second terminals of the first and second enhancement p-channel MOS transistor each being connected to the third input of the current-mirror circuit; and the second terminal point being connected to a second supply voltage.

6. The ECL-CMOS converter according to claim 2, wherein the current source is an MOS current source.

7. ECL-MOS converter for converting ECL levels into CMOS levels, comprising a voltage-to-current converter connected in series with a current-to-voltage converter, first and second inputs of the voltage-to-current converter being first and second inputs of the ECL-CMOS converter and an output of the current-to-voltage converter being an output of the ECL-CMOS converter, the voltage-to-current converter containing a current source, a differential stage and a current mirror circuit; the first input of the voltage-to-current converter being connected to a first input of the differential stage and the second input of the voltage-to-current converter being connected to a second input of the differential stage; a third input of the differential stage connected to a first terminal point via the current source; first and second outputs of the differential stage connected respectively to first and second inputs of the current-mirror circuit; the second output of the differential stage forming an output of the voltage-to-current converter; a third input of the current-mirror circuit connected to a second terminal point, the current-to-voltage converter containing a feedback CMOS inverter stage; a first input of the feedback CMOS inverter stage forming an input of the current-to-voltage converter and being connected via a feedback element to an output of the CMOS inverter stage; the output of the CMOS inverter stage forming the output of the current-to-voltage converter; a second input of the CMOS inverter stage being connected to a third terminal point and a third input thereof being connected to a fourth terminal point; and the feedback CMOS inverter stage also containing an enhancement p-channel MOS field effect transistor and an enhancement n-channel MOS field effect transistor; a first terminal of the enhancement p-channel field effect transistor being connected to the second input of the CMOS inverter stage; a first terminal of the enhancement n-channel MOS field effect transistor being connected to the third input of the CMOS inverter stage; the first input of the CMOS inverter stage being directly connected to a gate terminal of the p-channel enhancement MOS field effect transistor and to a gate terminal of the n-channel enhancement MOS field effect transistor; a second terminal of the p-channel enhancement MOS field effect transistor and a second terminal of the n-channel enhancement MOS field effect transistor each being connected to the output of the CMOS inverter stage; the third terminal point being connected to the second supply voltage and the fourth terminal point being connected to the first supply voltage.

8. The ECL-CMOS converter according to claim 7, wherein the feedback element is a feedback resistor.

9. The ECL-CMOS converter according to claim 7, wherein the differential stage contains first and second bipolar npn transistors; a base terminal of the first bipolar npn transistor forming the first input of the differential stage and a base terminal of the second bipolar npn transistor forming the second input of the differential stage; emitter terminals of the first and second bipolar npn transistors each being connected to the first terminal point via the current source; a collector of the second bipolar npn transistor forming the first output of the differential stage and a collector of the first bipolar npn transistor forming the second output of the differential stage; and the first terminal point being connected to a first supply voltage.

10. The ECL-CMOS converter according to claim 7, wherein the current-mirror circuit contains first and second enhancement p-channel MOS field effect transistors; a first terminal of the first enhancement p-channel MOS field effect transistor forming the first input of the current-mirror circuit and a first terminal of the second enhancement p-channel MOS transistor forming the second input of the current-mirror circuit; the first terminal of the first enhancement p-channel MOS transistor being connected to gate terminals of the first and second enhancement p-channel MOS transistor; second terminals of the first and second enhancement p-channel MOS transistor each being connected to the third input of the current-mirror circuit; and the second terminal point being connected to a second supply voltage.

11. The ECL-CMOS converter according to claim 7, wherein the current source is an MOS current source.

12. ECL-CMOS converter for converting ECL levels into CMOS levels, comprising a voltage-to-current converter connected in series with a current-to-voltage converter, first and second inputs of the voltage-to-current converter being first and second inputs of the ECL-CMOS converter and an output of the current-to-voltage converter being an output of the ECL-CMOS converter, the voltage-to-current converter containing a current source, a differential stage and a current mirror circuit; the first input of the voltage-to-current converter being connected to a first input of the differential stage and the second input of the voltage-to-current converter being connected to a second input of the differential stage; a third input of the differential stage connected to a first terminal point via the current source; first and second outputs of the differential stage connected respectively to first and second inputs of the current-mirror circuit; the second output of the differential stage forming an output of the voltage-to-current converter; a third input of the current-mirror circuit connected to a second terminal point, the current-to-voltage converter containing a feedback CMOS inverter stage; a first input of the feedback CMOS inverter stage forming an input of the current-to-voltage converter and being connected via a feedback element to an output of the CMOS inverter stage; the output of the CMOS inverter stage forming the output of the current-to-voltage converter; a second input of the CMOS inverter stage being connected to a third terminal point and a third input thereof being connected to a fourth terminal point the differential stage containing first and second bipolar npn transistors; a base terminal of the first bipolar npn transistor forming the first input of the differential stage and a base terminal of the second bipolar npn transistor forming the second input of the differential stage; emitter terminals of the first and second bipolar npn transistors each being connected to the first terminal point via the current source; a collector of the second bipolar npn transistor forming the first output of the differential stage and a collector of the first bipolar npn transistor forming the second output of the differential stage; the first terminal point being connected to a first supply voltage, the feedback CMOS inverter stage containing an enhancement p-channel MOS field effect transistor and an enhancement n-channel MOS field effect transistor; a first terminal of the enhancement p-channel field effect transistor being connected to the second input of the CMOS inverter stage; a first terminal of the enhancement n-channel MOS field effect transistor being connected to the third input of the CMOS inverter stage; the first input of the CMOS inverter stage being connected to a gate terminal of the p-channel enhancement MOS field effect transistor and to a gate terminal of the n-channel enhancement MOS field effect transistor; a second terminal of the p-channel enhancement MOS field effect transistor and a second terminal of the n-channel enhancement MOS field effect transistor each being connected to the output of the CMOS inverter stage; the third terminal point being connected to the second supply voltage and the fourth terminal point being connected to the first supply voltage.

13. The ECL-CMOS converter according to claim 12, wherein the feedback element is a feedback resistor.

14. The ECL-CMOS converter according to claim 12, wherein the current source is an MOS current source.

15. The ECL-CMOS converter according to claim 12, wherein the current-mirror circuit contains first and second enhancement p-channel MOS field effect transistors; a first terminal of the first enhancement p-channel MOS field effect transistor forming the first input of the current-mirror circuit and a first terminal of the second enhancement p-channel MOS transistor forming the second input of the current-mirror circuit; the first terminal of the first enhancement p-channel MOS-transistor being connected to gate terminals of the first and second enhancement p-channel MOS transistor; second terminals of the first and second enhancement p-channel MOS transistor each being connected to the third input of the current mirror circuit; and the second terminal point being connected to the second supply voltage.

* * * * *

REEXAMINATION CERTIFICATE (1827th)
United States Patent [19]
Muellner

[11] B1 5,012,137

[45] Certificate Issued Oct. 27, 1992

[54] ECL-CMOS CONVERTER

[75] Inventor: Ernst Muellner, Munich, Fed. Rep. of Germany

[73] Assignee: Siemens Aktiengesellschaft

Reexamination Request:
No. 90/002,590, Feb. 19, 1992

Reexamination Certificate for:
Patent No.: 5,012,137
Issued: Apr. 30, 1991
Appl. No.: 380,593
Filed: Jul. 17, 1989

[30] Foreign Application Priority Data

Jul. 22, 1988 [DE] Fed. Rep. of Germany ....... 3825010

[51] Int. Cl.$^5$ ............... H03K 19/0175; H03K 19/086; H03K 17/16
[52] U.S. Cl. .................... 307/475; 307/443; 307/446; 307/448; 307/542; 307/547; 307/570; 307/548; 330/257
[58] Field of Search .................... 307/491, 310, 296.6, 307/296.8, 475; 323/DIG. 907, 312, 313; 330/257

[56] References Cited

U.S. PATENT DOCUMENTS

| | | | |
|---|---|---|---|
| 4,453,095 | 6/1984 | Wrathall | 307/475 |
| 4,462,002 | 7/1984 | Schade | 330/257 |
| 4,906,871 | 3/1990 | Iida | 307/475 |

*Primary Examiner*—John S. Heyman

[57] ABSTRACT

An ECL-CMOS converter composed of a voltage-to-current converter and of a current-to-voltage converter is interconnected according to the "mismatched amplifier" principle. At two inputs of the voltage-to-current converter, the ECL input voltages are converted into a current that can be taken at an output of the voltage-to-current converter. The current is subsequently amplified in a current-to-voltage converter to an output voltage that is available at an output of the current-to-voltage converter. The current-to-voltage converter is composed of a feedback inverter stage, as a result thereof the operating point at an input of the current-to-voltage converter is stabilized at about half of an operating voltage of the converter.

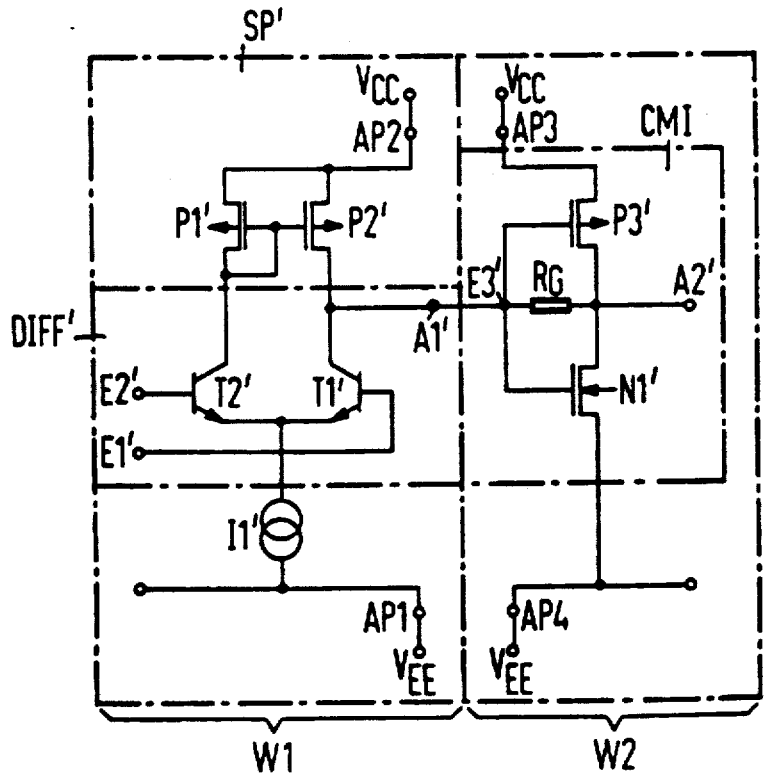

REEXAMINATION CERTIFICATE ISSUED UNDER 35 U.S.C. 307

THE PATENT IS HEREBY AMENDED AS INDICATED BELOW.

Matter enclosed in heavy brackets [] appeared in the patent, but has been deleted and is no longer a part of the patent; matter printed in italics indicates additions made to the patent.

AS A RESULT OF REEXAMINATION, IT HAS BEEN DETERMINED THAT:

Claims 1-6 are cancelled.

Claims 7 and 12 are determined to be patentable as amended.

Claims 8-11 and 13-15, dependent on an amended claim, are determined to be patentable.

7. ECL-MOS converter for converting ECL levels into CMOS levels, comprising a voltage-to-current converter *directly* connected in series with a current-to-voltage converter, first and second inputs of the voltage-to-current converter being first and second inputs of the ECL-CMOS converter and an output of the current-to-voltage converter being an output of the ECL-CMOS converter, the voltage-to-current converter containing a current source, a differential stage and a currrent mirror circuit; the first input of the voltage-to-current converter being connected to a first input of the differential stage and the second input of the voltage-to-current converter being connected to a second input of the differential stage; a third input of the differential stage connected to a first terminal point via the current source; first and second outputs of the differential stage connected respectively to first and second inputs of the current-mirror circuit; the second output of the differential stage forming an output of the voltage-to-current converter; a third input of the current-mirror circuit connected to a second terminal point, the current-to-voltage converter containing a feedback CMOS inverter stage; a first input of the feedback CMOS inverter stage forming an input of the current-to-voltage converter and being connected via a feedback element to an output of the CMOS inverter stage, *the input of the current-to-voltage converter also being directly connected to the output of the voltage-to-current converter;* the output of the CMOS inverter stage forming the output of the current-to-voltage converter; a second input of the CMOS inverter stage being connected to a third terminal point and a third input thereof being connected to a fourth terminal point; and the feedback CMOS inverter stage also containing an en-hancement p-channel MOS field effect transistor and an enhancement n-channel MOS field effecttransistor; a first terminal of the enhancement p-channel field effect transistor being connected to the second input of the CMOS inverter stage; a first terminal of the enhancement n-channel MOS field effect transistor being connected to the third input of the CMOS inverter stage; the first input of the CMOS inverter stage being directly connected to a gate terminal of the p-channel enhancement MOS field effect transistor and to a gate terminal of the n-channel enhancement MOS field effect transistor; a second terminal of the p-channel enhancement MOS field effect transistor and a second terminal of the n-channel enhancement MOS field effect transistor each being connected to the output of the CMOS inverter stage; *the second terminal point and* the third terminal point being connected to the second supply voltage and *the first terminal point and* the fourth terminal point being connected to the first supply voltage.

12. ECL-CMOS converter for converting ECL levels into CMOS levels, comprising a voltage-to-current converter *directly* connected in series with a current-to-voltage converter, first and second inputs of the voltage-to-current converter being first and second inputs of the ECL-CMOS converter and an output of the current-to-voltage converter being an output of the ECL-CMOS converter, the voltage-to-current converter containing a current source, a differential stage and a current mirror circuit; the first input of the voltage-to-current converter being connected to a first input of the differential stage and the second input of the voltage-to-current converter being connected to a second input of the differential stage; a third input of the differential stage connected to a first terminal point via the current source; first and second outputs of the differential stage connected respectively to first and second inputs of the current-mirror circuit; the second output of the differential stage forming an output of the voltage-to-current converter; a third input of the current-mirror circuit connected to a second terminal point, the current-to-voltage converter containing a feedback CMOS inverter stage; a first input of the feedback CMOS inverter stage forming an input of the current-to-voltage converter and being connected via a feedback element to an output of the CMOS inverter stage, *the input of the current-to-voltage converter also being directly connected to the output of the voltage-to-current converter;* the output of the CMOS inverter stage forming the output of the current-to-voltage converter; a second input of the CMOS inverter stage being connected to a third terminal point and a third input thereof being connected to a fourth terminal point, the differential stage containing first and second bipolar npn transistors; a base terminal of the first bipolar npn transistor forming the first input of the differential stage and a base terminal of the secondbipolar npn transistor forming the second input of the differential stage; emitter terminals of the first and second bipolar npn transistors each being connected to the first terminal point via the current source; a collector of the second bipolar npn transistor forming the first output of the differential stage and a collector of the first bipolar npn transistor forming the second output of the differential stage; the first terminal point being connected to a first supply voltage, the feedback CMOS inverter stage containing an enhancement p-channel MOS field effect transistor and an enhancement n-channel MOS field effect transistor; a first terminal of the enhancement p-channel field effect transistor being connected to the second input of the CMOS inverter stage; a first terminal of the enhancement n-channel MOS field effect transistor being connected to the third input of the CMOS inverter stage; the first input of the CMOS inverter stage being *directly* ep connected to a gate terminal of the p-channel enhancement MOS field effect transistor and to a gate terminal of the n-channel enhancement MOS field effect transistor; a second terminal of the p-channel enhancement MOS field effect transistor and a second terminal of the n-channel enhancement MOS field effect transistor each being connected to the output of the CMOS inverter stage; *the second terminal point and* the third terminal point being connected to the second supply voltage *the first terminal point* and the fourth terminal point being connected to the first supply voltage.

* * * * *